(12) United States Patent
Yu et al.

(10) Patent No.: US 6,455,331 B2
(45) Date of Patent: *Sep. 24, 2002

(54) PROCESS OF TOP-SURFACE-METALLURGY PLATE-UP BONDING AND REWIRING FOR MULTILAYER DEVICES

(75) Inventors: Roy Yu, Poughkeepsie, NY (US); Kamalesh S. Desai, Hopewell Junction, NY (US); Peter A. Franklin, Marlboro, NY (US); Suryanarayana Kaja, Hopewell Junction, NY (US); Kimberley A. Kelly, Poughkeepsie, NY (US); Yeeling L. Lee, Amawalk, NY (US); Arthur G. Merryman, Hopewell Junction, NY (US); Frank R. Morelli, Marlboro, NY (US); Thomas A. Wassick, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/867,364

(22) Filed: May 29, 2001

Related U.S. Application Data

(62) Division of application No. 09/452,935, filed on Dec. 2, 1999, now Pat. No. 6,248,599, which is a continuation of application No. 08/962,199, filed on Oct. 31, 1997, now Pat. No. 6,048,741.

(51) Int. Cl.$^7$ .......................... H01L 21/00; H01L 21/66; H01L 21/44; H01L 21/48; G01R 31/26
(52) U.S. Cl. ............................. 438/4; 438/15; 438/17; 438/115; 438/662
(58) Field of Search .............................. 438/4, 15, 17, 438/18, 115, 662, 906, 940

(56) References Cited

U.S. PATENT DOCUMENTS

| | | | |
|---|---|---|---|
| 4,078,102 A | | 3/1978 | Bendz et al. |
| 4,261,800 A | | 4/1981 | Beckenbaugh et al. |
| 4,466,864 A | * | 8/1984 | Bacon et al. ............ 204/229.7 |

(List continued on next page.)

FOREIGN PATENT DOCUMENTS

| | | | | |
|---|---|---|---|---|
| JP | 06037188 A | * | 2/1994 | ........... H01L/21/90 |

OTHER PUBLICATIONS

S. Mutnick, "Repairing Breaks in Printed Circuits", IBM Technical Disclosure Bulletin, vol. 8, No. 11, Apr. 1966.

(List continued on next page.)

Primary Examiner—David E. Graybill

(57) ABSTRACT

A device repair process that includes removing a passivation polyimide layer. The passivation polyimide layer is removed using a first-half ash followed by a second-half ash. The device is rotated during the second-half ash. The device is then cleaned using sodium hydroxide (NaOH) and a subsequent light ash step is implemented. After the passivation polyimide layer is removed, a seed layer is deposited on the device. A photoresist is formed on the seed layer and bond sites are formed in the photoresist. Repair metallurgy is plated through the bond sites. The bond sites are plated by coupling the device to a fixture and applying the current for plating to the fixture. The contact between the device and the fixture is made though bottom surface metallurgy. After plating, the residual seed layer is removed and a laser delete process is implemented to disconnect and isolate the nets of the device.

3 Claims, 7 Drawing Sheets

U.S. PATENT DOCUMENTS

| | | | |
|---|---|---|---|
| 4,624,749 A | | 11/1986 | Black et al. |
| 4,812,201 A | | 3/1989 | Sakai et al. |
| 4,919,971 A | | 4/1990 | Chen |
| 4,931,353 A | | 6/1990 | Tanielian |
| 4,994,154 A | | 2/1991 | Chen et al. |
| 5,141,602 A | | 8/1992 | Chen et al. |
| 5,144,747 A | | 9/1992 | Eichelberger |
| 5,145,714 A | | 9/1992 | Reisman et al. |
| 5,182,230 A | | 1/1993 | Donelon et al. |
| 5,250,843 A | | 10/1993 | Eichelberger |
| 5,262,279 A | | 11/1993 | Tsang et al. |
| 5,310,703 A | | 5/1994 | Visser et al. |
| 5,368,711 A | | 11/1994 | Poris |
| 5,536,584 A | * | 7/1996 | Sotokawa et al. .......... 428/458 |
| 5,559,654 A | * | 9/1996 | Das ............................ 360/110 |
| 5,568,682 A | | 10/1996 | Gates, Jr. et al. |
| 5,670,034 A | * | 9/1997 | Lowery ...................... 204/212 |
| 5,757,079 A | * | 5/1998 | McAllister et al. .......... 257/48 |
| 5,811,358 A | | 9/1998 | Tseng et al. |
| 5,937,269 A | * | 8/1999 | Yu et al. ....................... 438/15 |
| 5,972,723 A | * | 10/1999 | Bartley et al. ................ 438/15 |
| 6,048,741 A | | 4/2000 | Yu et al. |
| 6,054,749 A | * | 4/2000 | Bartley et al. .............. 257/529 |
| 6,147,003 A | * | 11/2000 | Tabara et al. ............... 438/704 |
| 6,248,599 B1 | * | 6/2001 | Yu et al. ..................... 438/115 |

OTHER PUBLICATIONS

"Laser Deposition of Metal Films With Organo–Metal Ink", IBM Technical Disclosure Bulletin, vol. 31, No. 7, Dec. 1988, pp. 45–46.

"Localized Laser Deposition of Gold From Solid Salts", Research Disclosure, Kenneth Mason Publications Ltd., England, No. 293, Sep. 1988.

F.M. Tappen, "Open Conductor Repair For Class Metal Module", IBM Technical Disclosure Bulletin, vol. 14, No. 10, Mar. 1972, pp. 2915.

* cited by examiner

PROCESS OF TOP-SURFACE-METALLURGY PLATE-UP BONDING AND REWIRING FOR MULTILAYER DEVICES

This application is a divisional of U.S. patent application Ser. No. 09/452,935, filed on Dec. 2, 1999, now U.S. Pat. No. 6,248,599, which is a continuation of U.S. patent application Ser. No. 08/962,199, filed on Oct. 31, 1997, now issued as U.S. Pat. No. 6,048,741.

FIELD OF THE INVENTION

The present invention generally relates to thin film repair and, more particularly, to the repair of thin film wiring using top-surface-metallurgy (or TSM) repair schemes.

BACKGROUND OF THE INVENTION

The repair of thin film wiring using TSM repair lines is well known. In the conventional repair process, a defective electrical wiring net, used to connect components on a circuit board, is disconnected from its internal wiring through specialized locations located at the "C4" joining pads. ("C4" means the Controlled-Collapsed-Chip-Connection technique used to connect semiconductor chips to the holes or vias between layers of a circuit board.) The net is reconstructed with equivalent electrical performance by connecting the X-Y grid of the repair lines on the top surface to the required C4 pads, matching the timing of the original net.

The reconstruction of the net is normally accomplished by joining the segments of the repair lines with individual gold slugs bonded to the TSM repair lines through a lasersonic bonding methodology. The gold slugs interconnect specific X and Y repair line segments to rebuild the net topography.

FIG. 1 illustrates a portion of a conventional multi-chip module (MCM) before repair. In FIG. 1, C4 connection 10 is connected to net 12 at via 14. X repair line 16 and Y repair lines 18, 20 are part of the top layer. Y repair lines 18, 20 are connected by Y repair line subway 22 using vias 24, 26. Vias 14, 24, 26 connect to down levels. C4 connection 10 has a repair elbow 28 and a bond site 30.

The reconstruction of the net during a conventional repair process is normally accomplished by joining the segments of the repair lines with individual gold slugs bonded to the TSM of the repair through conventional lasersonic bonding processes. The gold slugs interconnect specific X and Y repair line segments to rebuild the net topography. FIG. 2 is a plan view of the portion of the device shown in FIG. 1 after the conventional repair process. (FIG. 3 is a cross-sectional view taken along the line 3—3 of FIG. 2.) When a short is found in net 12, it is completely disconnected from the circuit using external delete 32 between C4 connection 10 and via 14. This process is repeated at every other C4 connection location for net 12. To replace this deleted net, a portion of X repair line 16 and Y repair lines 18, 20 must be used. Conventionally, X repair line 16 and Y repair lines 18, 20 are cut using deletes. Then C4 connection 10 is connected to X repair line 16 using gold slug 34, and X repair line 16 is connected to Y repair line 20 using gold slug 36.

One drawback of the conventional repair process illustrated in FIGS. 1–3 is that a relatively large number of repair lines are consumed for nets with multiple segments. As illustrated in FIG. 2, an X repair line and a Y repair line were necessary to replace net 12. This results in fewer nets being repairable. This drawback is illustrated in FIG. 4, which shows two nets. C4 connection 10 (a signal connection) is part of net 12; C4 connection 40 (also a signal connection) is part of the second net 42. Power-ground C4's 44, 46 are also shown. Because most defective nets run in the same general direction on the device, they require the use of the same top-surface repair lines. In such a case a part might be lost due to "unroutability," defined as insufficient repair lines to meet the repair requirements. Only one of the two nets illustrated in FIG. 4 can be repaired using the conventional process because both need access to X repair line 16.

The conventional gold lasersonic bonding technique works well for planarized thin film structures. In the new generation of multilayer thin film products using "CMOS" or Complementary Metal-Oxide-Semiconductor systems, however, the thin film structures are not planarized. The surface topography caused by the non-planarized films significantly reduces the effectiveness of the lasersonic bonding technique. This reduced effectiveness increases the risk of reliability defects associated with the bonds and reduces the yield of substrates which require a large number of bonds. This problem has effectively limited the number of defects that may be repaired and creates unnecessary yield loss. On some products, the yield loss may be as high as fifteen percent.

In view of the shortcomings of the prior art, a new process and system are needed to improve the repair process of thin film products. One approach, titled "Method for Repairing Defective Electrical Connections on Multi-Layer Thin Film (MLTF) Electronic Packages and the Resulting MLTF Structure," is the subject of U.S. patent application Ser. No. 08/577,677, filed on Dec. 21, 1995. Provided below is another approach.

SUMMARY OF THE INVENTION

To meet this and other needs, and in view of its purposes, the present invention is directed to a device repair process. The process includes removing a passivation polyimide layer. The passivation polyimide layer is removed using a first-half ash followed by a second-half ash. The device is rotated during the second-half ash. The device is then cleaned using sodium hydroxide (NaOH) and a subsequent light ash is implemented. After the passivation polyimide layer is removed, a seed layer is deposited on the device. A photoresist is formed on the seed layer and bond sites are formed in the photoresist. Repair metallurgy is plated through the bond sites. The bond sites are plated by coupling the device to a fixture and applying the current for plating to the fixture. After plating, the residual seed layer is removed and a laser delete process is implemented to disconnect and isolate the nets.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures.

DETAILED DESCRIPTION OF THE INVENTION

Overview

The present invention provides a process for multi-layer thin film substrate repair at the after-thin-films (ATF) stage or the end-of-line (EOL) stage. The TSM plate repair process is based on electrical testing, inspection, or both testing and inspection of the part to establish the list of nets requiring repair. Using the wiring structures present on the top surface of the substrate, new connections are laid out to rewire the defective nets. The TSM plate repair process provides individual bond connections, additional repair wiring, or both to restructure a net.

The repair process uses localized electrolytic plating to form bonds that permit creation of new thin film nets to replace those found defective by electrical testing and inspection. The present invention consists of a number of features that result in the formation of a unique repair process for rewiring defective nets and creating engineering changes in nets.

The TSM plate-up repair process of the present invention includes several unique process steps, including the uniform removal of a polyimide passivation layer across the device to expose the TSM. The TSM includes the repair line structures for repair. The TSM plate-up repair process also cleans the TSM in preparation for electroplating seed metallurgy deposition. The TSM plate-up repair process further includes an electrolytic plating process for the individual repair bonds and/or additional wiring compatible with the existing bond metallurgy and top surface metallurgy. Finally, the TSM plate-up repair process permits completion of localized electrolytic plating and insures a uniform plating thickness regardless of the area coverage or the number of bonds.

As a result, a wide selection of repair metallurgy may be used and an unlimited number of repair bonds may be formed. The TSM repair process also permits repair of non-standard defects, such as voltage bus bars, because different length connections can be easily fabricated. This versatility results from the flexibility of the exposure process. Further, the TSM plate-up repair process permits the creation of special routing alternatives especially for unroutability situations which exist when local grids are insufficient to permit conventional repair.

In addition, the TSM plate-up repair process of the present invention overcomes limitations on the number of bonds that can be applied to repair a defective substrate. Connections formed using the TSM plate-up repair process have excellent metal-to-metal adhesion, high reliability, and high yields. The TSM plate-up repair process may be used for different multi-level thin film structures having a number of layers.

DESCRIPTION OF THE EXEMPLARY EMBODIMENT

Figure 5:
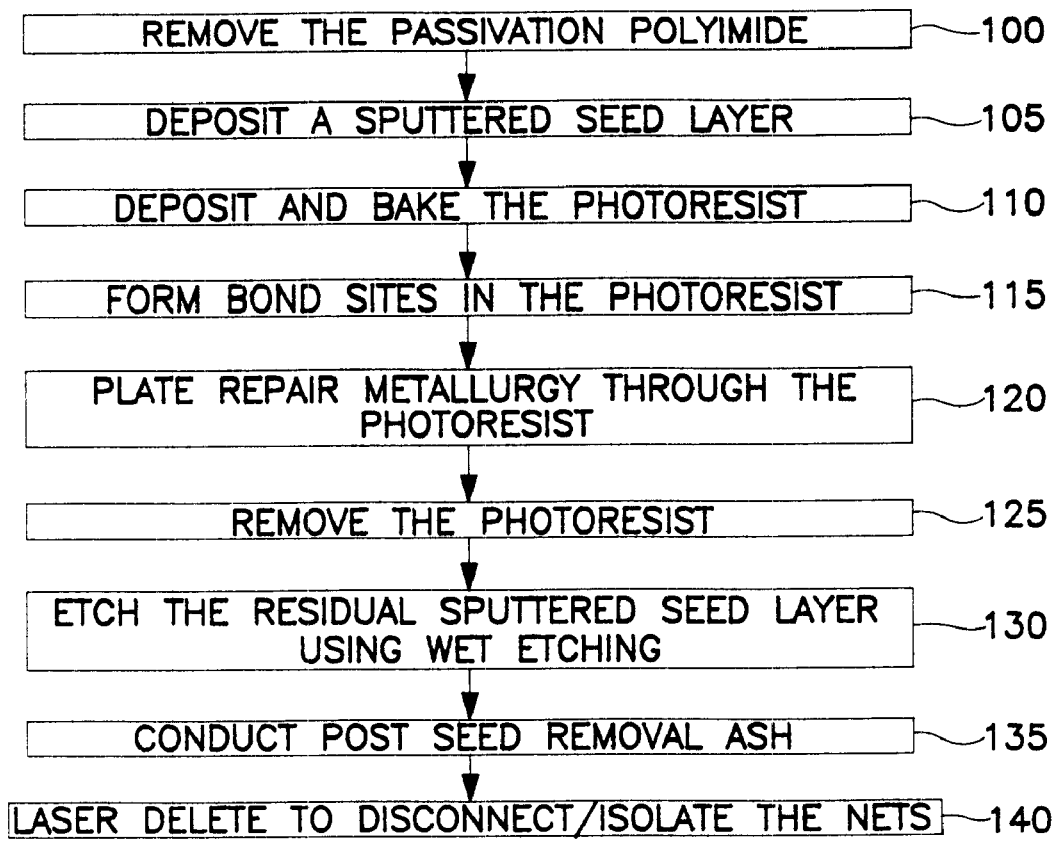
FIG. 5 is a flow chart diagram illustrating an exemplary embodiment of the present invention.

Referring now to the drawing, in which like reference numbers refer to like elements throughout the Figures, FIG. 5 is a flow chart illustrating the steps of the top surface metallurgy (TSM) plate-up repair process of the present invention. At step 100, the passivation polyimide layer is removed. Step 100 is not performed if a passivation polyimide layer has not been formed on the device. An ash-back process is used to uniformly remove the passivation polyimide layer to produce a device that is equivalent to a device that does not have the passivation polyimide layer. The process conditions are chosen to minimize the opportunity for over-etch while suitably preparing the surface for subsequent seed metal deposition because there is no etch stop in the structure of the part to ensure the proper ash depth control.

The polyimide removal process is described below with reference to FIG. 5A. At step 1005, a first-half ash is implemented. The first-half ash is stopped roughly half-way through the passivation polyimide layer. The total processing time to implement the first-half ash is, for example, nine minutes. A reference point on the substrate is placed toward the center of the ashing tool to perform the ashing process. Due to the inherent non-uniformity of the ashing tool, more polyimide will be removed from the corners than in the center of the device.

At step 1010, a second-half ash is implemented. During the second-half ash, the device is spin rotated with the reference point away from the center of tool. The total processing time implemented in the second-half ash is, for example, another nine minutes. The spin rotation causes more polyimide to be removed in the central reference point area to compensate for the relatively slow ash rate in that area during the first-half ash. The positioning of the ashing tool and the rotation of the device results in an average 7 $\mu$m polyimide removal across the entire surface of the device with about 1 $\mu$m variation.

After the extensive ashing, the resulting surface of the device is unsuitable for the deposition of the seed metal. The surface is covered with various impurities from the removed polyimide. For example, an adhesion promoter (such as the "Al 100" product available from Ohio Valley Specialty Chemical of Marietta, Ohio) is typically used in the formation of the polyimide layer and the adhesion promoter traps debris and prevents them from being removed either from the surface of the polyimide or from the TSM. At step 1015, a sodium hydroxide (NaOH) cleaning is implemented to eliminate the debris. The NaOH cleaning step is the same strip operation typically used to remove photoresist. This cleaning operation removes substantially all of the residual debris on the surface and smoothes the surface to facilitate seed metal deposition.

At step 1020, a light ash process is implemented. Although the NaOH cleaning step removes debris, the NaOH may leave a trace amount of organic residue on the surface of the device. The light ash process removes the residue, completing the preparation of the surface for seed metal deposition.

Returning to FIG. 5, a sputtered seed layer is deposited on the device at step 105. At step 110, a photoresist is deposited and baked on the seed layer. At step 115, the photoresist is exposed and developed to form bond sites in the photoresist. At step 120, the repair metallurgy is plated through the bond sites formed in the photoresist.

For conventional, full pattern plating, the area being patterned represents 10%–50% of the total surface area of the device. This effective target area is a critical parameter for any electrolytic plating process: the current density of the plating process is set within tight constraints to ensure a reliable, consistent metal structure. A large area requires a large current and a small area requires a small current. There is a limit of target area, below which conventional electrolytic plating is no longer operational, because a plating power supply has a lower current limit which is maintained to ensure proper operation.

This limitation is a problem in using electrolytic plating for fabrication of repair bonds because the bonds are small and the number of bonds varies considerably from part to part. As a result, standard power supplies and control software may not ensure a uniform bond thickness. Plating step 120 can be done with electroless plating as well as with electrolytic plating, although the choice of metallurgy and properties is not at flexible for electroless plating as it is for electrolytic plating.

The present invention implements a "trickle" plating process which avoids the need to match the plating current to the bond area required for the repair. A fixture with a large physically active area, which acts both to hold the device during plating and to provide a sufficiently large target area for the power supply, is linked to the part to be repaired through the bottom-surface-metallurgy (BSM) of the device.

In this configuration, the current of the power supply is dialed to the area of the fixture, which is selected to be within the power supply operating range. The bonds on the device are biased at the same plating voltage as the fixture during plating through the bottom surface metallurgy contact with the fixture. Because the bonds that require plating represent a small area of a substantially larger area (i.e., the area of the fixture), the bonds will be plated using the same current density as that on the fixture regardless of their size and number. There is a small deviation in the thickness of the bonds depending on the relative position of the bond to the fixture. Bonds farther away from the fixture normally have a thicker bond. Bonds closer to the fixture normally have a thinner bond. Nevertheless, the bonds may be plated within a range of thickness that is reliable and uniform.

This process is different from that of "thieving" plating used in standard electrolytic plating. "Thieving" plating uses a "dummy" target to surround the actual target to smooth out the non-uniformity in the edge area of the active target. The active area in this plating thief must be of sufficient size to take the needed current. In contrast, the trickle plating process according to the present invention has no current directed to the intended active area. The current travels to the "dummy" target, the fixture. A small amount of current trickles to the active area through the electrical connection between the fixture and the device and is independent of the size and number of the bonds in the active areas of repair bonds.

Returning to FIG. 5, the photoresist is removed at step 125. At step 130, the residual sputtered seed layer is etched using wet etching. At step 135, a post seed removal ash is performed. At step 140, a laser delete process is performed to disconnect and isolate the nets.

Figure 6:
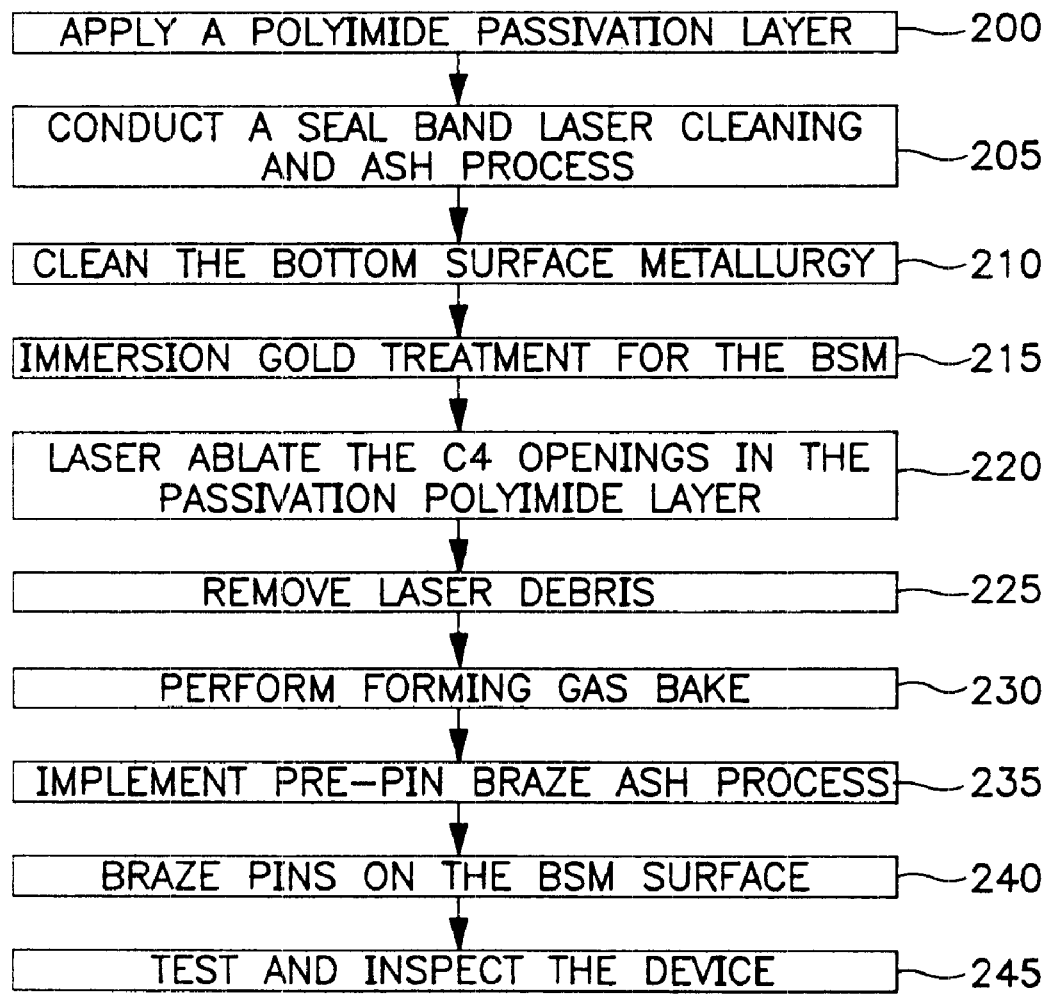
FIG. 6 is a flow chart diagram illustrating an exemplary embodiment of the present invention for completing the device which has been repaired using the process illustrated in FIG. 5.

As is shown in FIG. 6, the repaired part is then electrically tested to assure functionality and then processed through standard follow-on procedures. At step 200, a polyimide passivation layer is applied to the device and baked. At step 205, a seal band laser cleaning and ash process is performed. At step 210, the BSM is cleaned. At step 215 the device is subject to a process of immersion gold treatment for the BSM. At step 220, the C4 openings in the passivation polyimide layer are laser ablated. At step 225, laser debris are removed. At step 230, a forming gas bake is performed. At step 235, a pre-pin braze ash process is implemented on both surfaces of the device. At step 240, pins are brazed on the BSM surface. At step 245, a final test and inspection of the part is implemented.

Figure 7A:
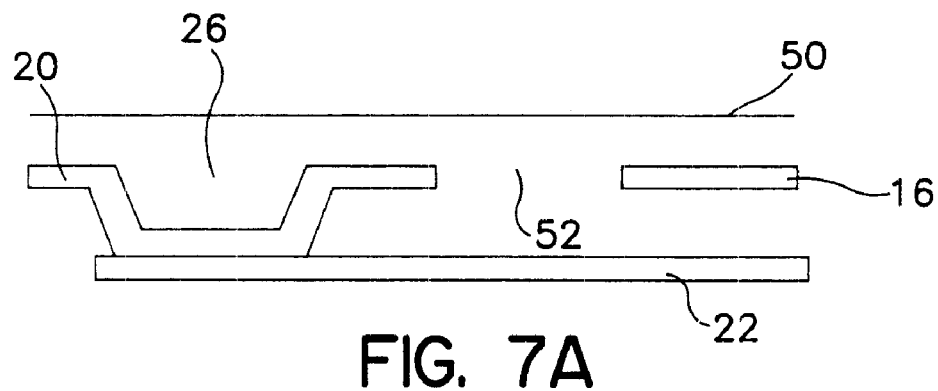
FIG. 7A is a cross-sectional view of a device before application of the process of the present invention for repairing the device.

FIGS. 7A through 7F provide cross-sectional views of a device at various stages during the application of the process of the present invention for repairing the device. In FIG. 7A, the device is illustrated before application of the process. Shown are X repair line 16, Y repair line 20, Y repair line subway 22, via 26, and passivation polyimide layer 50. A missing link 52 exists between X repair line 16 and Y repair line 20; a link is needed to close missing link 52.

Figure 5A:
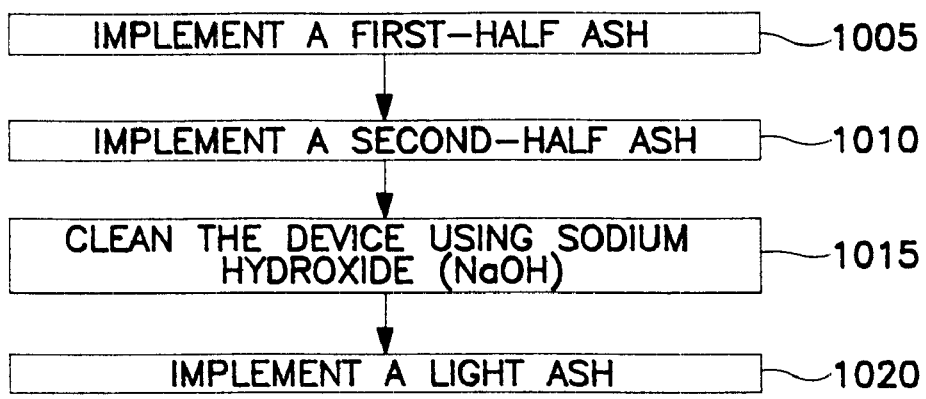
FIG. 5A is a flow chart diagram illustrating a step of the process described in FIG. 5 in further detail.
Figure 7B:
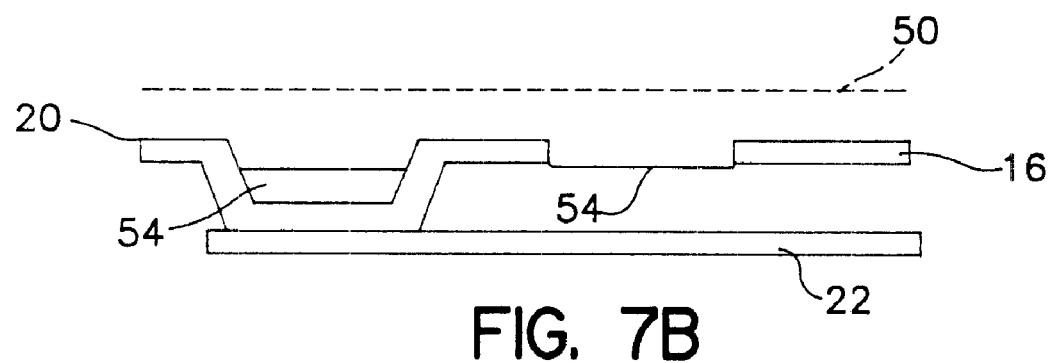
FIG. 7B is a cross-sectional view showing a first step in the process of FIG. 5.

The first step 100 in the process of FIG. 5, illustrated more specifically in FIG. 5A, is removal of passivation polyimide layer 50. The device following the removal of passivation polyimide layer 50 is shown in FIG. 7B (passivation polyimide layer 50 is illustrated in dashed lines). Ash stop 54 forms part of the removal process step. Removal of passivation polyimide layer 50 exposes X repair line 16, Y repair line 20, and repair elbow 28 of C4 connection 10 (not shown in FIG. 7B).

Figure 7C:
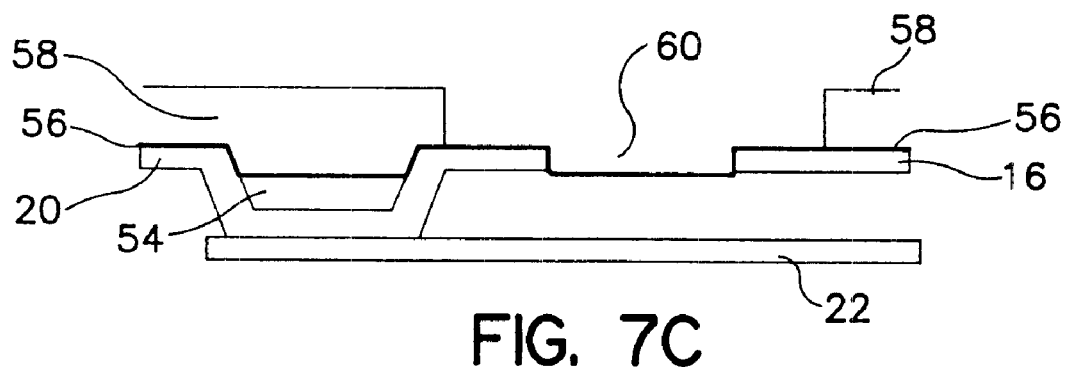
FIG. 7C is a cross-sectional view showing the next three steps in the process of FIG. 5.
Figure 7D:
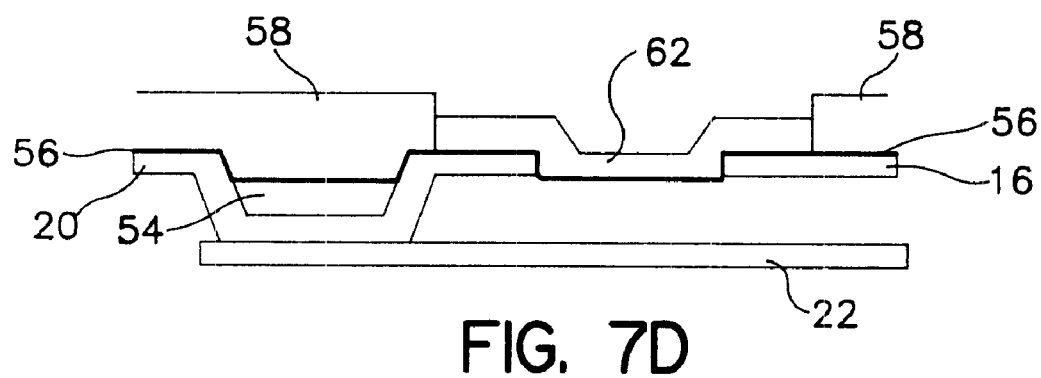
FIG. 7D is a cross-sectional view showing the fifth step in the process of FIG. 5.
Figure 7E:
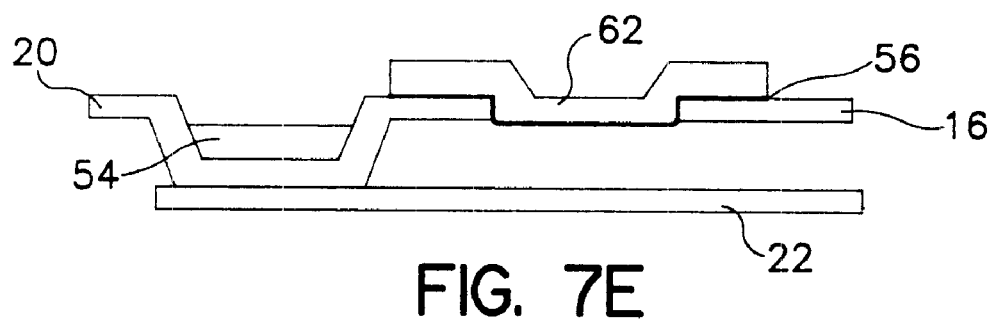
FIG. 7E is a cross-sectional view showing the sixth, seventh, and eighth steps in the process of FIG. 5.
Figure 7F:
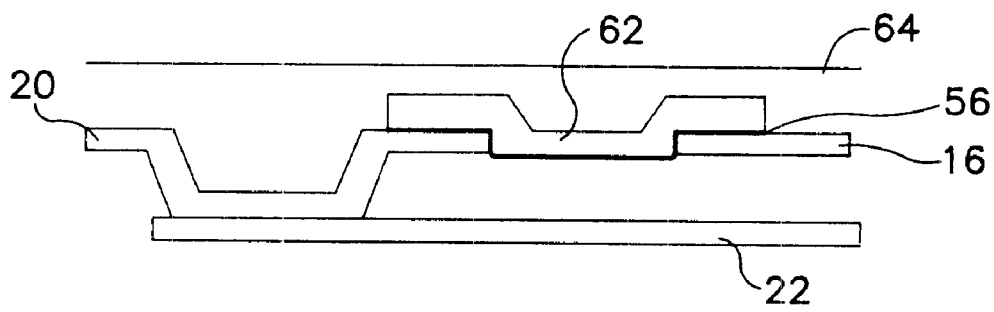
FIG. 7F is a cross-sectional view showing a first step in the process of FIG. 6.

Illustrated in FIG. 7C is the device following steps 105 (deposit a sputtered seed layer 56), 110 (deposit and bake the photoresist 58), and 115 (form bond sites 60 in photoresist 58) of FIG. 5. FIG. 7D shows the device after process step 120 of FIG. 5, illustrating a plate-up bond 62 formed through the BSM contact with a target fixture. Illustrated in FIG. 7E is the device following steps 125 (remove photoresist 58), 130 (etch residual seed layer 56), and 135 (remove ash stop 54) of FIG. 5. Finally, FIG. 7F shows the device after process step 200 of FIG. 6 in which the device is re-passivated, with passivation polyimide layer 64, to complete the repair process.

Figure 1:
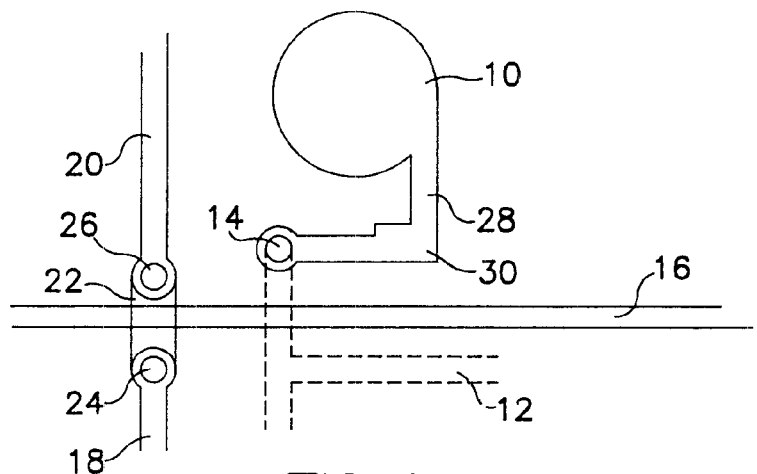
FIG. 1 is a plan view of a portion of a device before repair.
Figure 2:
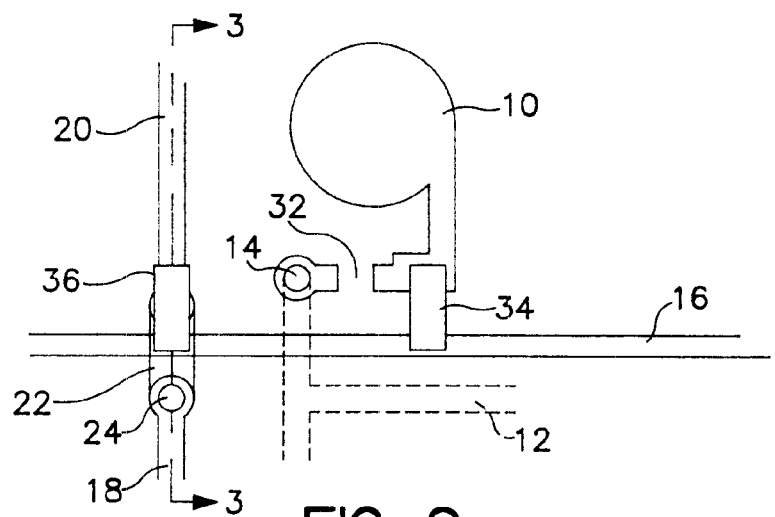
FIG. 2 is a plan view of the portion of the device shown in FIG. 1 after a conventional repair process.
Figure 3:
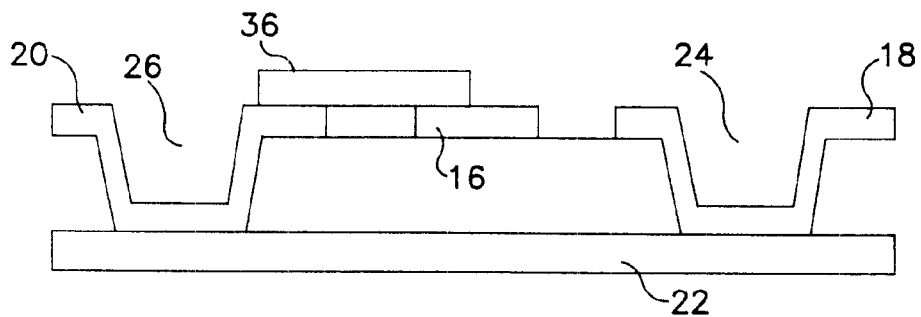
FIG. 3 is a cross-sectional view of a conventional repair bond taken along the line 3—3 of FIG. 2.
Figure 4:
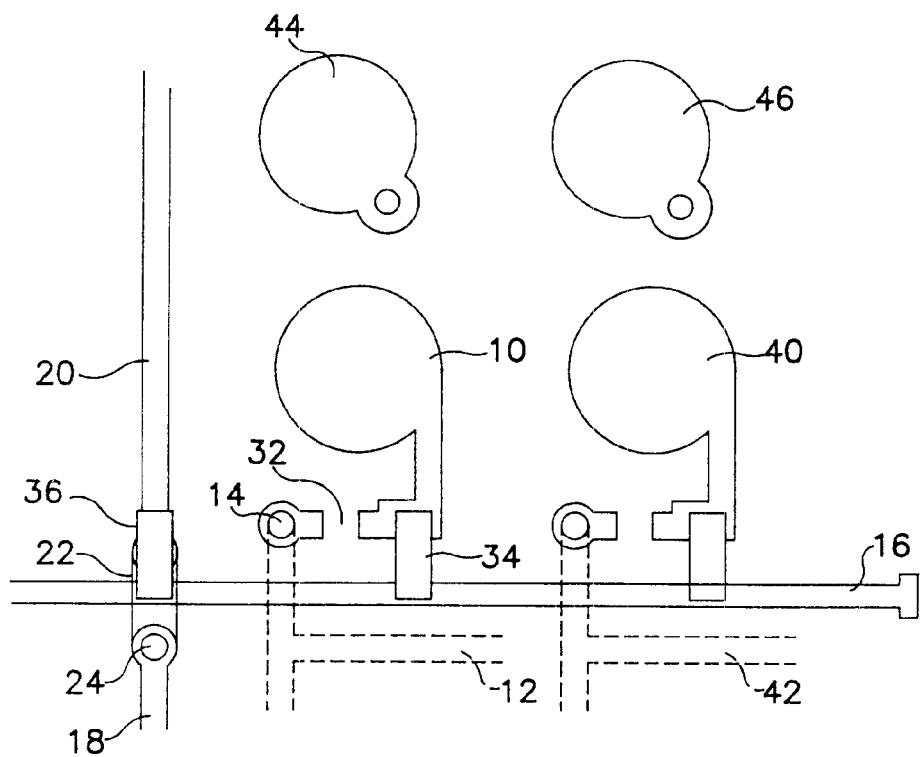
FIG. 4 is a plan view of a portion of a device illustrating two nets where unroutability renders a conventional repair process unworkable.
Figure 10:
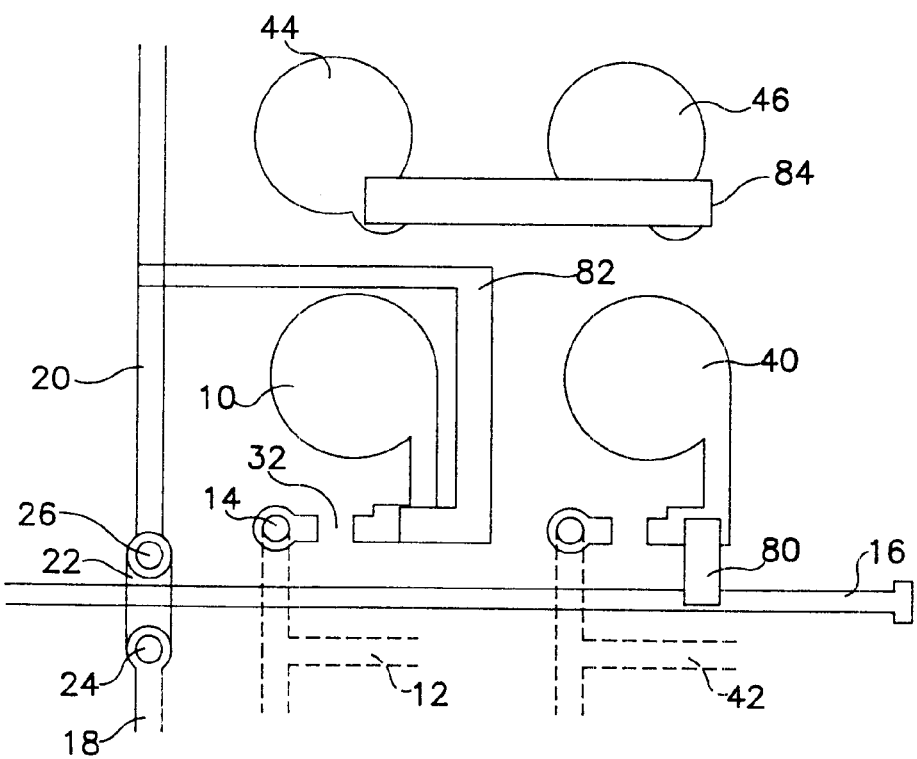
FIG. 10 is a plan view of a portion of a device illustrating two nets after extra wiring is formed using the plate-up repair process according to the present invention.
Figure 8:
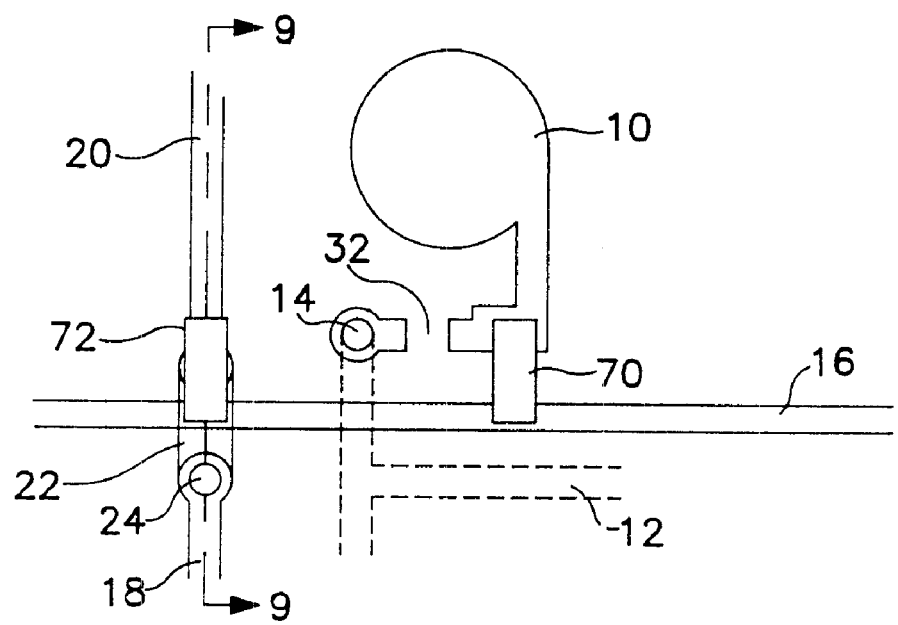
FIG. 8 is a plan view of the portion of the device shown in FIG. 1 after the plate-up repair process according to the present invention.
Figure 9:
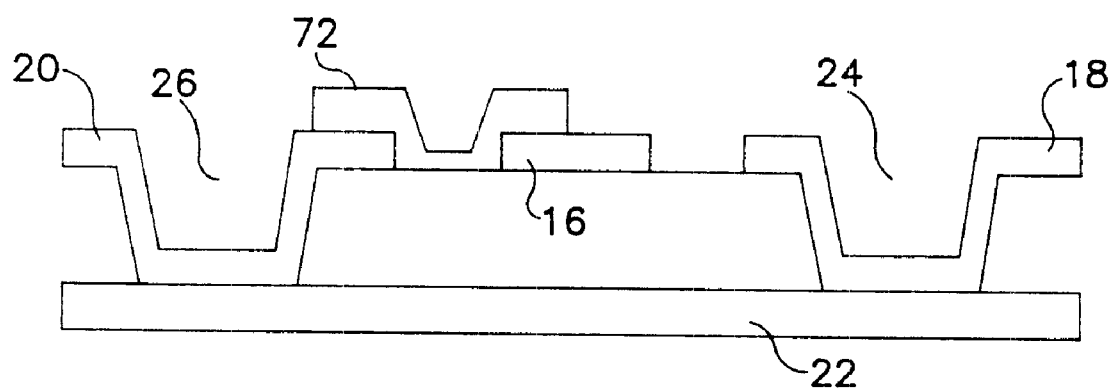
FIG. 9 is a cross-sectional view of a plate-up repair bond taken along the line 9—9 of FIG. 8.

The advantages of the plate-up process of the present invention over the conventional repair process can be seen by comparing FIGS. 8, 9, and 10 with FIGS. 2, 3, and 4, respectively. FIG. 8 is a plan view of the portion of the device shown in FIG. 1 after the plate-up repair process according to the present invention. Shown in FIG. 8 are plate-up bonds 70 and 72, replacing gold slugs 34 and 36, respectively, of the conventional process shown in FIG. 2. Otherwise, the device elements of FIGS. 2 and 8 are identical. FIG. 9 is a cross-sectional view of plate-up repair bond 72 taken along the line 9—9 of FIG. 8. FIG. 9 corresponds to FIG. 3 illustrating the conventional process. FIGS. 8 and 9 demonstrate that the plate-up process of the present invention achieves the same results as the conventional process in the simple case of repair of a single net 12.

The advantageous versatility of the plate-up process is illustrated in FIG. 10. FIG. 10 is a plan view of a portion of a device illustrating two nets after the plate-up repair process according to the present invention. As discussed above and illustrated in FIG. 4, only one of the two nets can be repaired using the conventional process because both need access to X repair line 16. The plate-up process of the present invention permits repair of the two nets. TSM plate-up repair bond 80 connects C4 connection 40 to X repair line 16. Although conventional gold slugs 34 and 36 are unsuitable for connecting C4 connection 10 to Y repair line 20, the relatively long distance between C4 connection 10 and Y repair line 20 can be covered by paste-up repair fan-out 82. Finally, a TSM plate-up repair bus 84 can be provided to connect power-ground C4's 44 and 46. The plate-up process of the present invention provides the flexibility, absent from conventional processes, needed to repair devices.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A method for fabricating a semiconductor device having wiring nets, the method comprising the steps of:

(a) depositing a sputtered seed layer on the device;

(b) forming a photoresist having bond sites;

(c) plating repair metallurgy through the bond sites;

(d) conducting a laser delete process to disconnect and isolate at least one of the wiring nets of the device;

(e) performing a first-half ash;

(f) performing a second-half ash;

(g) cleaning the device; and (h) performing a further ash, wherein the device is a semiconductor device.

2. A method for fabricating a device having wiring nets, the method comprising the steps of:

(a) removing a layer of the device;

(b) depositing a sputtered seed layer on the device;

(c) forming a photoresist having bond sites;

(d) plating repair metallurgy through the bond sites; and (e) conducting a laser delete process to disconnect and isolate at least one of the wiring nets of the device, wherein the device is a semiconductor device.

3. A method for fabricating a device having wiring nets, the method comprising the steps of:

(a) removing a layer of the device;

(b) depositing a sputtered seed layer on the device;

(c) forming a photoresist with bond sites on the seed layer;

(d) plating repair metallurgy through the bond sites;

(e) removing the seed layer; and (f) conducting a laser delete process to disconnect and isolate at least one of the wiring nets of the device, wherein the device is a semiconductor device.

* * * * *